United States Patent
Peng et al.

(10) Patent No.: US 9,660,615 B2
(45) Date of Patent: May 23, 2017

(54) FLIP-FLOP DEVICES WITH CLOCK SHARING

(71) Applicant: MediaTek Inc., Hsin-Chu (TW)

(72) Inventors: Meng-Cheng Peng, Taoyuan (TW); Rei-Fu Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/608,723

(22) Filed: Jan. 29, 2015

(65) Prior Publication Data

US 2016/0226469 A1    Aug. 4, 2016

(51) Int. Cl.
*H03K 3/289* (2006.01)
*H03K 3/356* (2006.01)
*H03K 3/012* (2006.01)
*H03K 3/037* (2006.01)

(52) U.S. Cl.
CPC ........... *H03K 3/012* (2013.01); *H03K 3/0372* (2013.01)

(58) Field of Classification Search
USPC ........ 327/115, 116, 117, 118, 199, 355–360, 327/202, 203, 208–215, 218; 377/47, 48
See application file for complete search history.

(56) References Cited

U.S. PATENT DOCUMENTS

| | | | | |
|---|---|---|---|---|
| 5,223,833 A * | 6/1993 | Akata | ..................... | H03M 9/00 341/100 |
| 6,020,770 A * | 2/2000 | Madsen | .................. | H03M 9/00 327/115 |
| 7,675,439 B2 * | 3/2010 | Chang | ..................... | H03M 9/00 341/100 |
| 2007/0182473 A1 * | 8/2007 | Pacha | ................ | H03K 3/35625 327/218 |
| 2009/0153212 A1 * | 6/2009 | Jeffries | .................. | H03K 23/44 327/254 |
| 2014/0062556 A1 * | 3/2014 | Chen | ...................... | H03K 23/40 327/161 |
| 2014/0253196 A1 * | 9/2014 | Du | ...................... | H01L 27/0688 327/202 |

* cited by examiner

*Primary Examiner* — Brandon S Cole
(74) *Attorney, Agent, or Firm* — McClure, Qualey & Rodack, LLP

(57) ABSTRACT

A flip-flop device is provided. The flip-flop device includes a first flip-flop and a clock controller. The first flip-flop receives a first clock signal and a second clock signal for operation. The clock controller receives a clock source signal and generates the first clock signal and the second clock signal according to the clock source signal. Each of the first clock signal and the second clock signal switches between a first voltage level and a second voltage level. For each of the first clock signal and the second clock signal, a period of the first voltage level is shorter than a period of the second voltage level. The period of the first voltage level of the first clock signal and the period of the first voltage level of the second clock signal are non-overlapping.

9 Claims, 4 Drawing Sheets

FLIP-FLOP DEVICES WITH CLOCK SHARING

BACKGROUND OF THE INVENTION

Field of the Invention

The invention relates to a flip-flop without a built-in inverter related to clock inversion, and more particularly, to flip-flop device in which a plurality of flip-flops share clock signals.

Description of the Related Art

A conventional flip-flop comprises two latch circuits and a build-in inverter. This build-in inverter is used to inverse a clock signal, which is received by the flip-flop, to an inverse clock signal. However, the build-in inverter is always toggled and consumes large power. When an electronic device comprises a plurality of conventional flip-flops, the power consumption of the flip-flops is disadvantageous to the power saving of the electronic device.

BRIEF SUMMARY OF THE INVENTION

Thus, it is desirable to provide a flip-flop which receives two external clock signals without an inverter for clock inversion. Accordingly, a plurality of provided flip-flops can share the two external clock signals, thereby reducing the power consumption of the entire circuitry.

One exemplary embodiment of a flip-flop device is provided. The flip-flop device comprises a first flip-flop and a clock controller. The first flip-flop receives a first clock signal and a second clock signal for operation. The clock controller receives a clock source signal and generates the first clock signal and the second clock signal according to the clock source signal. The second clock signal is inverse to the first clock signal and delayed from the first clock signal by a predetermined time period.

In an embodiment, the clock controller comprises a delay circuit and an inverter circuit. The delay circuit receives the clock source signal and delays the clock source signal to generate a delayed clock signal. The inverter circuit receives the delayed clock signal and inverts the delayed clock signal to generate the second clock signal. The clock controller transmits the clock source signal to serve as the first clock signal. The predetermined time period is shorter than an internal delay time of the first flip-flop.

Another exemplary embodiment of a flip-flop device is provided. The flip-flop device comprises a first flip-flop and a clock controller. The first flip-flop receives a first clock signal and a second clock signal for operation. The clock controller receives a clock source signal and generates the first clock signal and the second clock signal according to the clock source signal. Each of the first clock signal and the second clock signal switches between a first voltage level and a second voltage level. For each of the first clock signal and the second clock signal, a period of the first voltage level is shorter than a period of the second voltage level. The period of the first voltage level of the first clock signal and the period of the first voltage level of the second clock signal are non-overlapping.

In an embodiment, the first flip-flop is a rising edge-triggered flip-flop, and the first voltage level is higher than the second voltage level. In another embodiment, the first flip-flop is a falling edge-triggered flip-flop, and the first voltage level is lower than the second voltage level.

An exemplary embodiment of a flip-flop for generating an output signal is provided. The flip-flop comprises a first clock input terminal, a second clock input terminal, an input terminal, a first latch, and a second latch. The first clock input terminal receives a first clock signal. The second clock input terminal receives a second clock signal. The input terminal receives an input signal. The first latch circuit receives the input signal and the first clock signal and generates a latch signal according to the input signal and the first clock signal. The second latch circuit receives the latch signal and the second clock signal and generates the output signal according to the latch signal and the second clock signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
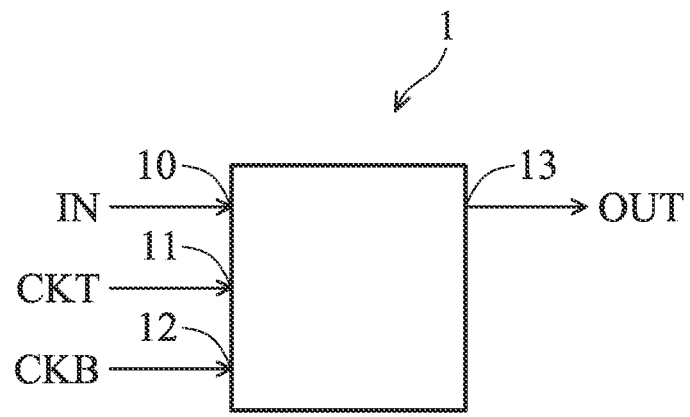
FIG. 1 shows an exemplary embodiment of a flip-flop.
Figure 2:
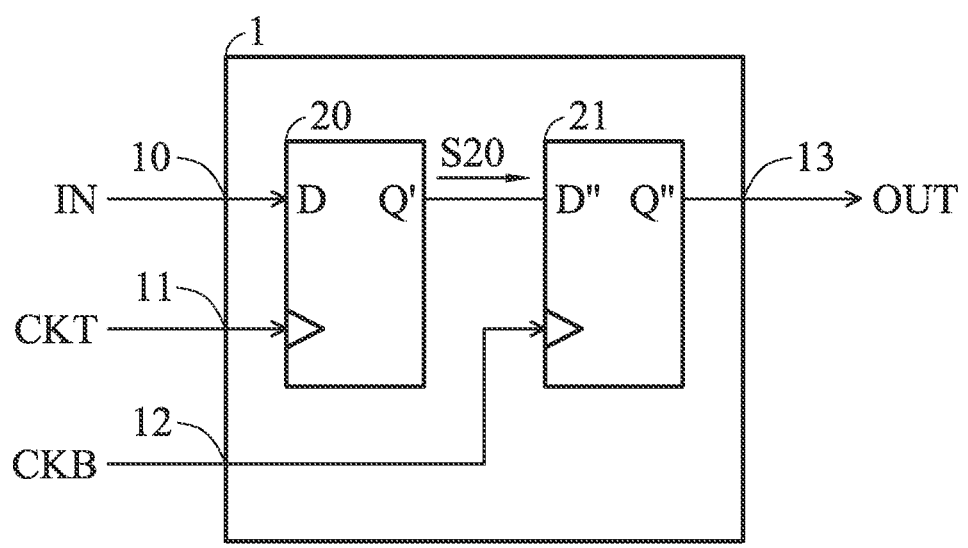
FIG. 2 shows another exemplary embodiment of a flip-flop.

FIG. 1 shows an exemplary embodiment of a flip-flop. Referring to FIG. 1, the flip-flop 1 comprises an input terminal 10, two clock input terminals 11 and 12, and an output terminal 13. In the embodiment, the flip-flop 1 can be implemented by a rising edge-triggered flip-flop or a falling edge-triggered flip-flop. The flip-flop 1 receives an input signal IN through the input terminal 10. Further, the flip-flop receives two external clock signals CKT and CKB through the clock input terminals 11 and 12 respectively. According to the input signal IN and the clock signals CKT and CKB, the flip-flop 1 operates to generate an output signal OUT at the output terminal 13. The detailed circuitry of the flip-flop 1 is shown in FIG. 2. As shown in FIG. 2, the flip-flop 1 comprises two latch circuits 20 and 21. The latch circuit 20 receives the input signal IN and the clock signal CKT and generates a latch signal S20 according to the input signal IN and the clock signal CKT. The latch circuit 21 receives the latch signal S20 and the clock signal CKB and generates the output signal OUT according to the latch signal S20 and the clock signal CKB. In the embodiment of FIGS. 1 and 2, the flip-flop 1 does not comprise any inverter applied for clock inversion. However, the flip-flop 1 directly receives two external clock signals CKT and CKB through the clock input terminals 11 and 12. That is, the clock signals CKT and CKB for the operation of the flip-flop 1 are provided from a circuit or device disposed at the outside of the flip-flop 1. Both the clock signals CKT and CKB are not generated by the flip-flop 1 itself. As described above, there is no built-in inverter in the flip-flop 1. Thus, the power consumption induced by the always toggled built-in inverter in each conventional flip-flop is eliminated, such that the power consumption of the flip-flop 1 can be reduced.

Figure 3:
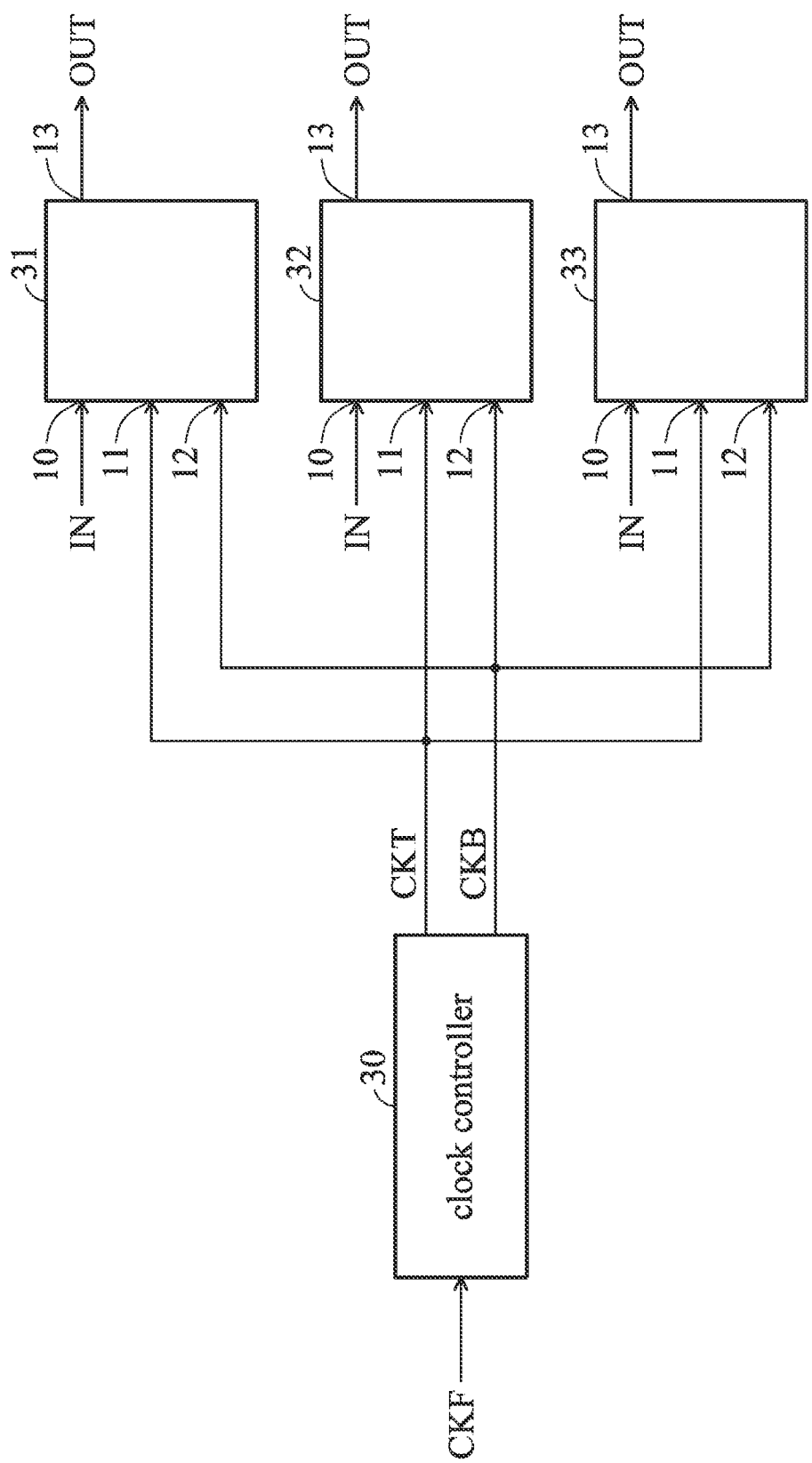
FIG. 3 shows an exemplary embodiment of a flip-flop device.

FIG. 3 shows an exemplary embodiment of a flip-flop device. Referring to FIG. 3, the flip-flop device 3 comprises a clock controller 30 and a plurality of flip-flops. In the embodiment of FIG. 3, three flip-flops 31-33 are given as an example. Each of the flip-flops 31-33 has the same structure of the flip-flop 1 of FIG. 1. In other words, each of the flip-flops 31-33 does not comprise any built-in inverter applied for clock inversion, and, however, directly receives two external clock signals for operation. The clock controller 30 receives a clock source signal CKF and generates the clock signals CKT and CKB according to the clock source signal CKF. Since the clock signals CKT and CKB for the operation of each flip-flop are provided externally, the flip-flops 31-33 can share the clock signals generated by the clock controller 30. As shown in FIG. 3, all of the flip-flops 31-33 receive the clock signals CKT and CKB. According to the input signal IN and the clock signals CKT and CKB, each of the flip-flops 31-33 operates to generate the corresponding output signal OUT at its output terminal 13. Since the clock signals CKT and CKB for the operations of the flip-flops 31-33 are generated by the clock controller 30, no built-in inverter for clock inversion is necessary to each flip-flop 1. Accordingly, the power consumption induced by the always toggled built-in inverter in each conventional flip-flop is not happened anymore, thereby reducing the power consumption of the entire flip-flop device 3.

Figure 4:
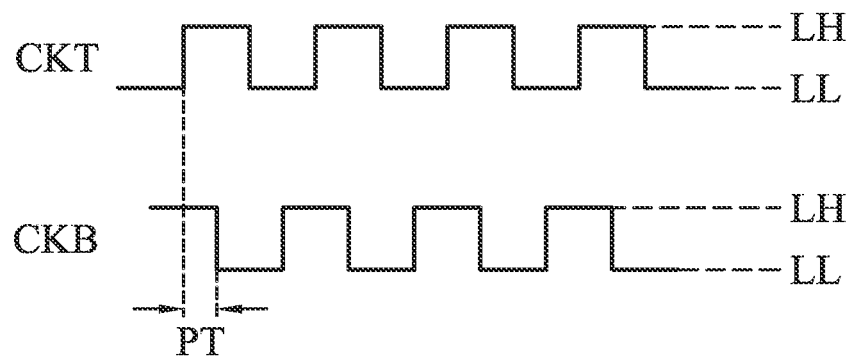
FIG. 4 shows one exemplary embodiment of waveforms and timing of clock signals.
Figure 5:
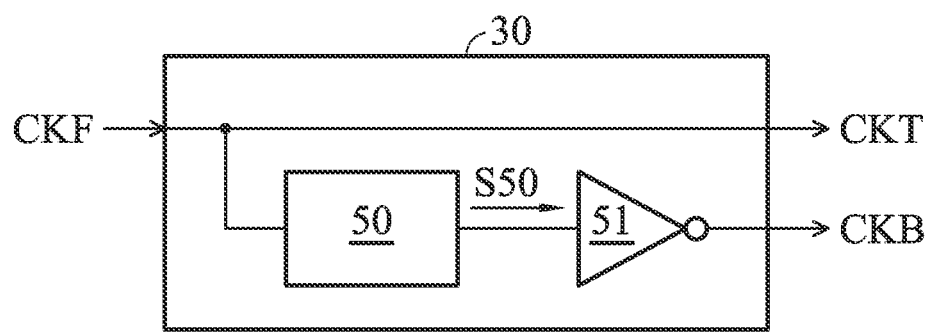
FIG. 5 shows an exemplary embodiment of a clock controller which generates the clock signals of FIG. 4.

FIG. 4 shows one exemplary embodiment of the waveforms and timing of the clock signals CKT and CKB. The waveforms and timing of the clock signals CKT and CKB in FIG. 4 are applied when each of the flip-flops 31-33 is a rising edge-triggered flip-flop. As shown in FIG. 4, each of the clock signals CKT and CKB switches between a high voltage level LH and a low voltage level LL which is lower than the high voltage level LH. The clock signal CKB is inverse to the clock signal CKT and further delayed from the clock signal CKT by a predetermined time period PT. FIG. 5 shows an exemplary embodiment of the clock controller 30 which generates the clock signals CKT and CKB with the waveforms and timing of FIG. 4. Referring to FIG. 5, the clock controller 30 comprises a delay circuit 50 and an inverter circuit 51. The delay circuit 50 receives the clock source signal CKF and further delays the clock source signal CKF by the predetermined time period PT to generate a delay clock signal S50. The inverter circuit 51 is coupled to the delay circuit 50 to receive the delay clock signal S50. Then, the inverter circuit 51 inverts the delay clock signal S50 to generate the clock signal CKB. Moreover, the clock controller 30 transmits the received clock source signal CKF to its output terminal to serve as the clock signal CKT. In other words, the timing of the clock signal CKT is the same as the timing of the clock source signal CKF. Due to the delay of the predetermined time period, the period of the high voltage level LH of the clock signal CKT overlaps the period of the high voltage level LH of the clock signal CKB partially. In the embodiment of FIGS. 4 and 5, the predetermined time period PT is shorter than the internal delay time of each of the flip-flops 31-33. In this embodiment, referring to FIG. 2, the internal delay time of each flip-flop is the delay of the signal between the latch circuits 20 and 21.

Figure 6:
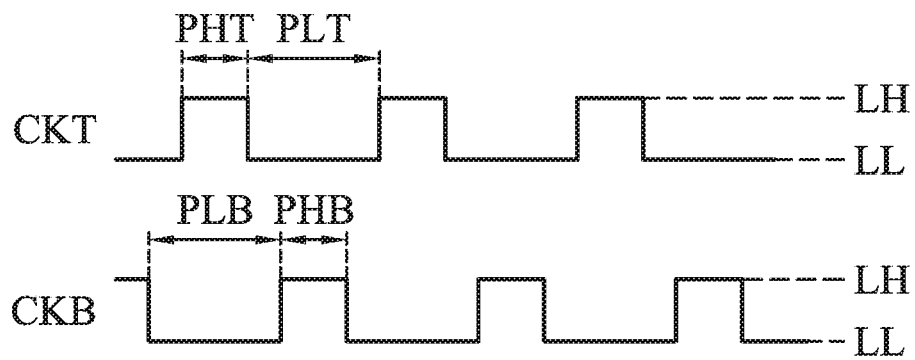
FIG. 6 shows another exemplary embodiment of waveforms and timing of clock signals.

FIG. 6 shows another exemplary embodiment of the waveforms and timing of the clock signals CKT and CKB. The waveforms and timing of the clock signals CKT and CKB in FIG. 6 are applied when each of the flip-flops 31-33 is a rising edge-triggered flip-flop. As shown in FIG. 6, each of the clock signals CKT and CKB switches between a high voltage level LH and a low voltage level LL which is lower than the high voltage level LH. For the clock signal CKT, the period PHT of the high voltage level LH is shorter than the period PLT of the low voltage level LL. Similarly, for the clock signal CKB, the period PHB of the high voltage level LH is shorter than the period PLB of the low voltage level LL. The period PHT of the high voltage level LH of the clock signal CKT is equal to the period PHB of the high voltage level LH of the clock signal CKB, and the period PLT of the low voltage level LL of the clock signal CKT is equal to the period PLB of the low voltage level LL of the clock signal CKB. Note that, the period PHT of the high voltage level LH of the clock signal CKT and the period PHB of the high voltage level LH of the clock signal CKB are non-overlapping. For the rising edge-triggered flip-flops 31-33, since the period PHT of the high voltage level LH of the clock signal CKT does not overlap the period PHB of the high voltage level LH of the clock signal CKB, write-through does not occurs, such that the flip-flops 31-33 of the flip-flop device 3 can generate corresponding output signals OUT correctly.

Figure 7:
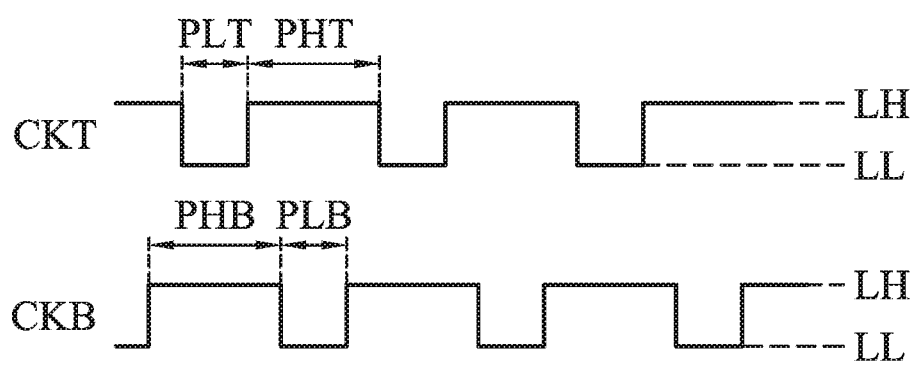
FIG. 7 shows further another exemplary embodiment of waveforms and timing of clock signals.

FIG. 7 shows another exemplary embodiment of the waveforms and timing of the clock signals CKT and CKB. The waveforms and timing of the clock signals CKT and CKB in FIG. 7 are applied when each of the flip-flops 31-33 is a falling edge-triggered flip-flop. As shown in FIG. 7, each of the clock signals CKT and CKB switches between a high voltage level LH and a low voltage level LL which is lower than the high voltage level LH. For the clock signal CKT, the period PLT of the low voltage level LL is shorter than the period PHT of the high voltage level LH. Similarly, for the clock signal CKB, the period PLB of the low voltage level LL is shorter than the period PHB of the high voltage level LH. The period PHT of the high voltage level LH of the clock signal CKT is equal to the period PHB of the high voltage level LH of the clock signal CKB, and the period PLT of the low voltage level LL of the clock signal CKT is equal to the period PLB of the low voltage level LL of the clock signal CKB. Note that, the period PLT of the low voltage level LL of the clock signal CKT and the period PLB of the low voltage level LL of the clock signal CKB are non-overlapping. For the falling edge-triggered flip-flops 31-33, since the period PLT of the low voltage level LL of the clock signal CKT does not overlap the period PLB of the low voltage level LL of the clock signal CKB, write-through does not occurs, such that the flip-flops 31-33 of the flip-flop device 3 can generate corresponding output signals OUT correctly.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flip-flop device comprising:
   a first flip-flop receiving a first clock signal and a second clock signal for operation; and a clock controller receiving a clock source signal and generating the first clock signal and the second clock signal according to the clock source signal, wherein each of the first clock signal and the second clock signal switches between a first voltage level and a second voltage level, wherein for each of the first clock signal and the second clock signal, a period of the first voltage level is shorter than a period of the second voltage level, and wherein the period of the first voltage level of the first clock signal and the period of the first voltage level of the second clock signal are non-overlapping.

2. The flip-flop device as claimed in claim 1, wherein the first flip-flop is a rising edge-triggered flip-flop, and the first voltage level is higher than the second voltage level.

3. The flip-flop device as claimed in claim 1, wherein the first flip-flop is a falling edge-triggered flip-flop, and the first voltage level is lower than the second voltage level.

4. The flip-flop device as claimed in claim 1 further comprising:
   a second flip-flop receiving the first clock signal and the second clock signal for operation.

5. A flip-flop for generating an output signal, comprising:
   a first clock input terminal receiving a first clock signal;
   a second clock input terminal receiving a second clock signal;
   an input terminal receiving an input signal;
   a first latch circuit receiving the input signal and the first clock signal and generating a latch signal according to the input signal and the first clock signal; and
   a second latch circuit receiving the latch signal and the second clock signal and generating the output signal according to the latch signal and the second clock signal, wherein each of the first clock signal and the second clock signal switches between a first voltage level and a second voltage level, and a period of the first voltage level of the first clock signal overlaps a period of the first voltage level of the second clock signal partially, and wherein for each of the first clock signal and the second clock signal, a period of the second voltage level is shorter than the period of the first voltage level, and wherein the period of the second voltage level of the first clock signal and the period of the second voltage level of the second clock signal are non-overlapping.

6. The flip-flop as claimed in claim 5, wherein the second clock signal is delayed from the first clock signal by a predetermined time period.

7. The flip-flop as claimed in claim 5, wherein timing of the first clock signal is the same as timing of the clock source signal.

8. The flip-flop as claimed in claim 5, wherein the flip-flop is a falling edge-triggered flip-flop, and the first voltage level is higher than the second voltage level.

9. The flip-flop as claimed in claim 5, wherein the flip-flop is a rising edge-triggered flip-flop, and the first voltage level is lower than the second voltage level.

\* \* \* \* \*